United States Patent
Hewett et al.

(10) Patent No.: US 6,746,958 B1
(45) Date of Patent: Jun. 8, 2004

(54) METHOD OF CONTROLLING THE DURATION OF AN ENDPOINT POLISHING PROCESS IN A MULTISTAGE POLISHING PROCESS

(75) Inventors: Joyce S. Oey Hewett, Austin, TX (US); Gerd Franz Christian Marxsen, Radebeul (DE); Anthony J. Toprac, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/817,536

(22) Filed: Mar. 26, 2001

(51) Int. Cl.$^7$ .......................................... H01L 21/4763
(52) U.S. Cl. .................. 438/687; 438/8; 438/633; 438/692; 438/697
(58) Field of Search ................ 438/687, 633, 438/631, 690, 691, 692, 697, 626, 14, 16, 17, 18, 7, 8

(56) References Cited

U.S. PATENT DOCUMENTS 6,274,478 B1 * 8/2001 Farkas et al. ............... 438/597

* cited by examiner

Primary Examiner—Carl Whitehead, Jr.
Assistant Examiner—Thanhha S Pham
(74) Attorney, Agent, or Firm—Williams, Morgan & Amerson, P.C.

(57) ABSTRACT

The present invention is directed to a method of controlling chemical mechanical polishing operations to control the duration of an endpoint polishing process. The method comprises providing a wafer having a layer of copper formed thereabove, performing a first timed polishing operation for a duration ($t_1$) on the layer of copper at a first platen to remove a majority of the layer of copper, performing an endpoint polishing operation on the layer of copper at a second platen to remove substantially all of the layer of copper, determining a duration ($t_2^{ept}$) of the endpoint polishing operation performed on the layer of copper at the second platen, and determining, based upon a comparison between the determined duration ($t_2^{ept}$) of the endpoint polishing operation and a target value for the duration of the endpoint polishing operations, a duration ($t_1$) of the timed polishing operation to be performed on a subsequently processed layer of copper at the first platen. In another embodiment, the invention further comprises modifying, based upon a variance between the determined duration ($t_2^{ept}$) of the endpoint polishing operation and a target value for the duration ($t_2^{ept}$) of the endpoint polishing operation, the duration ($t_1$) of the timed polishing operation to be performed on a subsequently processed layer of copper at the first platen.

28 Claims, 4 Drawing Sheets

METHOD OF CONTROLLING THE DURATION OF AN ENDPOINT POLISHING PROCESS IN A MULTISTAGE POLISHING PROCESS

BACKGROUND OF THE INVENTION

1. Field of the Invention

The present invention is generally directed to the field of semiconductor manufacturing, and, more particularly, to a method of controlling the duration of an endpoint polishing process in a multistage polishing process.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

In modern integrated circuit devices, millions of transistors are formed above a surface of a semiconducting substrate. To perform their intended functions, these transistors, or groups of transistors, are electrically coupled together by many levels of conductive interconnections, i.e., conductive metal lines and plugs. These conductive lines and plugs allow electrical signals to propagate throughout the integrated circuit device.

In general, these conductive interconnections are formed in layers of insulating material, e.g., silicon dioxide, HSQ, or other materials that may have a dielectric constant less than approximately 4. The insulating materials electrically isolate the various conductive interconnections and tend to reduce capacitive coupling between adjacent metal lines when the integrated circuit device is in operation. Moreover, modern integrated circuit devices are very densely packed, i.e., there is very little space between the semiconductor devices, as well as between the conductive metal lines. Accordingly, the amount of insulating material positioned between adjacent metal lines, and other surrounding conductive structures, both above and below the metal lines, is very important.

As the demand for high performance integrated circuit devices continues to increase, circuit designers and manufacturers look for ways to improve device performance. Recently, copper has become the material of choice for conductive interconnections for high performance integrated circuit devices, e.g., microprocessors, due to its lower resistance as compared to, for example, aluminum.

Typically, a layer of insulating material will be formed on or above a semiconducting substrate. Thereafter, a plurality of openings will be formed in the layer of insulating material using known photolithographic and etching techniques. Then, after the formation of a barrier metal layer, e.g., tantalum, a layer of copper will be formed above the insulating layers and in the openings in the insulating layer by performing an electroplating process. Next, the excess copper material positioned outside of the openings in the insulating layer is removed by performing one or more chemical mechanical polishing operations.

Such chemical mechanical polishing operations may involve polishing tools in a sequence of polishing operations. For example, the bulk of the excess copper may be removed during an initial, timed polishing process. The removal rate during the initial timed etch process may be relatively high. Thereafter, an endpoint etch process may be performed to remove the remaining copper material. The removal rate during this endpoint process may be relatively low. Additional polishing operations may be performed on the device after these steps are performed.

Problems may arise when the incoming layer of copper is thicker or thinner than anticipated. For example, if the incoming thickness of the layer of copper is thicker than anticipated, the initial timed polishing process may not remove enough of the incoming layer of copper. As a result, the endpoint process may be performed for too long of a duration. As a result, manufacturing efficiencies are reduced and the overall output of the manufacturing facility may be reduced. Alternatively, if the layer of copper is thinner than anticipated, the initial timed polishing operation may remove too much of the copper layer, to the point that the operations may unnecessarily consume too much of the underlying insulating layer.

The present invention is directed to a method that may solve, or at least reduce, some or all of the aforementioned problems.

SUMMARY OF THE INVENTION

The present invention is directed to a method of controlling chemical mechanical polishing operations to control the duration of an endpoint polishing process. The method comprises providing a wafer having a layer of copper formed thereabove, performing a first timed polishing operation for a duration ($t_1$) on the layer of copper at a first platen to remove a majority of the layer of copper, and performing an endpoint polishing operation on the layer of copper at a second platen to remove substantially all of the layer of copper remaining after the timed polishing operation performed at platen 1. The method further comprises determining a duration ($t_2^{ept}$) of the endpoint polishing operation performed on the layer of copper at the second platen, and determining, based upon a comparison between the determined duration ($t_2^{ept}$) of the endpoint polishing operation at platen 2 and a target value for the duration of the endpoint polishing operations, a duration ($t_1$) of the timed polishing operation to be performed on a subsequently processed layer of copper at the first platen. In another embodiment, the invention further comprises modifying, based upon a variance between the determined duration ($t_2^{ept}$) of the endpoint polishing operation and a target value for the duration ($t_2^{ept}$) of the endpoint polishing operation, the duration ($t_1$) of the timed polishing operation to be performed on a subsequently processed layer of copper at the first platen.

BRIEF DESCRIPTION OF THE DRAWINGS

The invention may be understood by reference to the following description taken in conjunction with the accompanying drawings, in which like reference numerals identify like elements, and in which.

Figure 1:
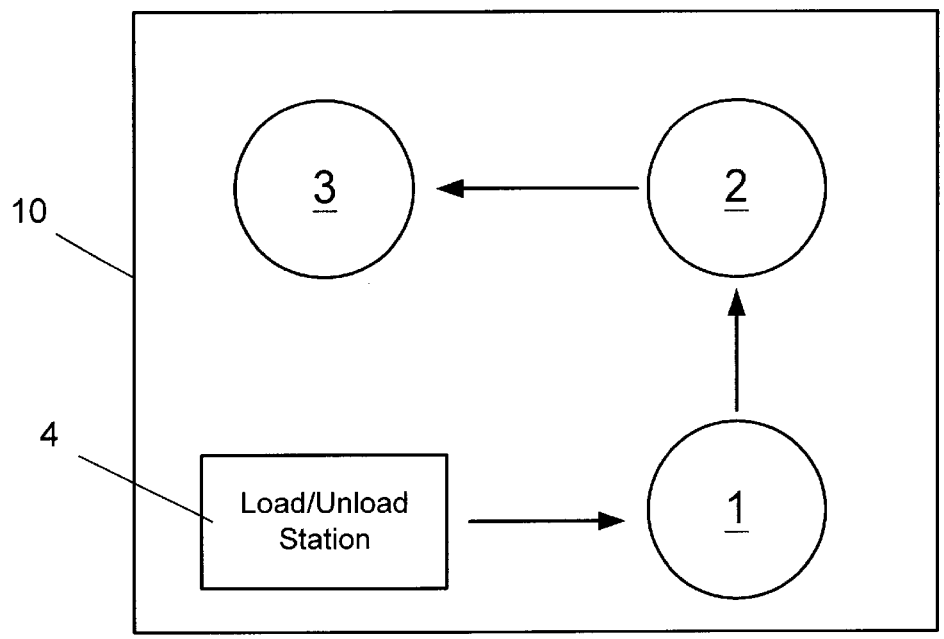
FIG. 1 is schematic view of a polishing tool that may be used with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention.

In general, the present invention is directed to a method of controlling the duration of an endpoint polishing process in a multistage polishing process. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

FIG. 1 is a schematic description of an Applied Materials Mirra copper polishing tool, a polishing tool 10 that may be used with the present invention. The Applied Materials tool may be purchased from Applied Materials located in Santa Clara, Calif. The polishing tool 10 is comprised of three polishing platens, platen 1, platen 2 and platen 3, and a load/unload station 4. The polishing tool 10 may be used in forming conductive interconnections comprised of copper in modem integrated circuit devices. In general, as described more fully below, each wafer is subjected to various polishing operations at each of the platens 1–3. Wafers are processed at all four stations, i.e., platens 1–3 and the load/unload station 4, in parallel. After completion of the longest process time, all wafers are moved to the next station.

Figure 2:
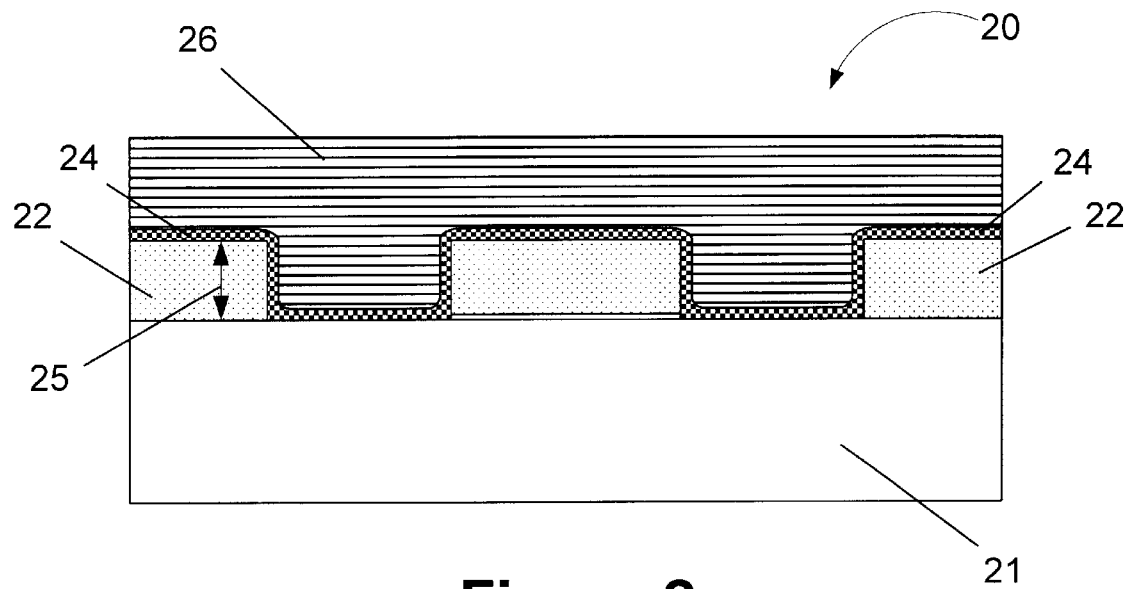
FIG. 2 is a cross-sectional view of a partially formed integrated circuit device comprised of a layer of metal formed above a patterned layer of insulating material.

FIGS. 2–6 are cross-sectional views of a partially formed integrated circuit device that will be used to describe the various polishing operations performed at each of the platens 1–3. As shown in FIG. 2, the partially formed integrated circuit device 20 is comprised of a patterned layer of insulating material 22 formed above a structure 21, a barrier metal layer 24, and a layer of metal 26, e.g., copper. The patterned layer of insulating material 22 has a thickness 25, as shown in FIG. 2. The structure 21 is intended to be representative in nature in that it may be a semiconducting substrate, a previously formed layer of material, e.g., a layer of silicon dioxide, or a previously formed stack of layers of insulating material having a plurality of conductive interconnections formed in each layer.

The various layers depicted in FIG. 2 may be comprised of a variety of materials, and they may be formed by a variety of techniques. For example, the structure 21 may be a previously formed layer of silicon dioxide that is formed by a chemical vapor deposition ("CVD") process using TEOS as a constituent gas, and it may have a thickness ranging, for example, from approximately 1000–3000 nm. The patterned layer of insulating material 22 may be formed from a variety of materials, e.g., silicon dioxide, silicon nitride, HSQ, materials having a dielectric constant less than 3, etc., and it may have a thickness ranging, for example, from approximately 500–1500 nm. The patterned layer of insulating material 22 may be formed by blanket depositing a layer of insulating material, and, thereafter, patterning the layer of material using known photolithography and etching techniques to result in the patterned layer of insulating material 22 shown in FIG. 2.

Thereafter, the barrier metal layer 24 may be conformally deposited above the patterned layer of insulating material 22 using a variety of process methods, e.g., CVD, plasma enhanced CVD ("PECVD"), physical vapor deposition ("PVD"), sputtering, etc. The barrier metal layer 24 may be comprised of a variety of materials, and its thickness may vary. In one illustrative embodiment, where conductive interconnections comprised of copper are being formed, the barrier metal layer 24 is comprised of tantalum, and it may have a thickness ranging, for example, from approximately 10–30 nm.

Thereafter, the metal layer 26 comprised of, for example, copper, is formed above the barrier metal layer 24 by known electroplating techniques. Typically, in the case where the metal layer 26 is comprised of copper, this process involves the formation of a copper seed layer (not shown) above the barrier metal layer 24, and, thereafter, positioning the partially formed integrated circuit device 20 in an electroplating bath to form the metal layer 26

Figure 3:
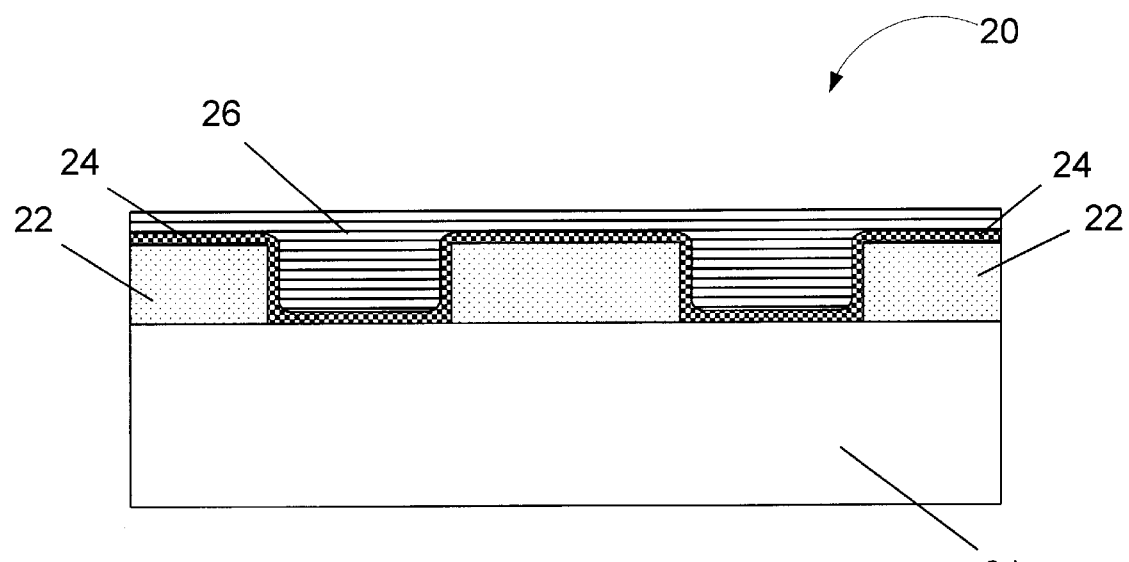
FIG. 3 is a cross-sectional view of the device shown in FIG. 2 after a majority of the layer of metal has been removed at a first polishing platen of the polishing tool.

The present invention will now be further described with reference to the specific embodiment wherein the metal layer 26 is comprised of copper. However, the present invention should not be considered as limited to the polishing of copper unless such limitation is clearly set forth in the appended claims. At platen 1 of the polishing tool 10, a majority, and typically the bulk, of the copper layer 26 is removed. A relatively high polisher arm downforce is used to achieve an aggressive removal rate on the order of approximately 8–16 nm/sec (80–160 Å /sec) of copper. The polishing process performed at platen 1 is a timed process whereby in one application, approximately 50–80% of the copper layer 26 above the patterned lay of insulating material 22 is removed. FIG. 3 depicts the wafer after polishing operations have been completed at platen 1.

Figure 4:
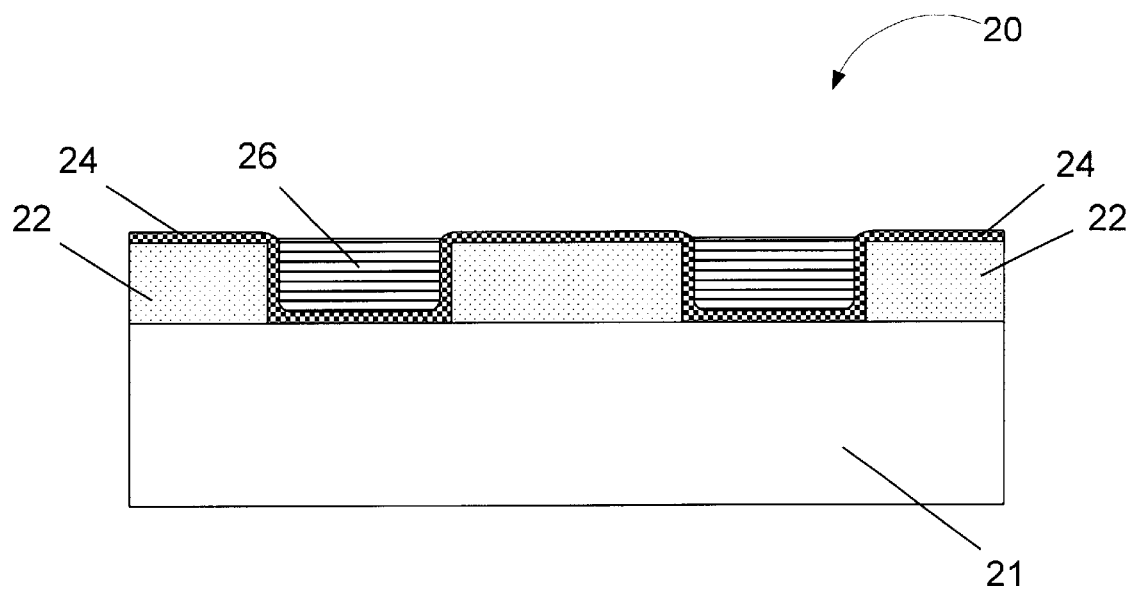
FIG. 4 is a cross-sectional view of the device shown in FIG. 3 after an endpoint polishing operation has been performed at a second polishing platen of the polishing tool.
Figure 5:
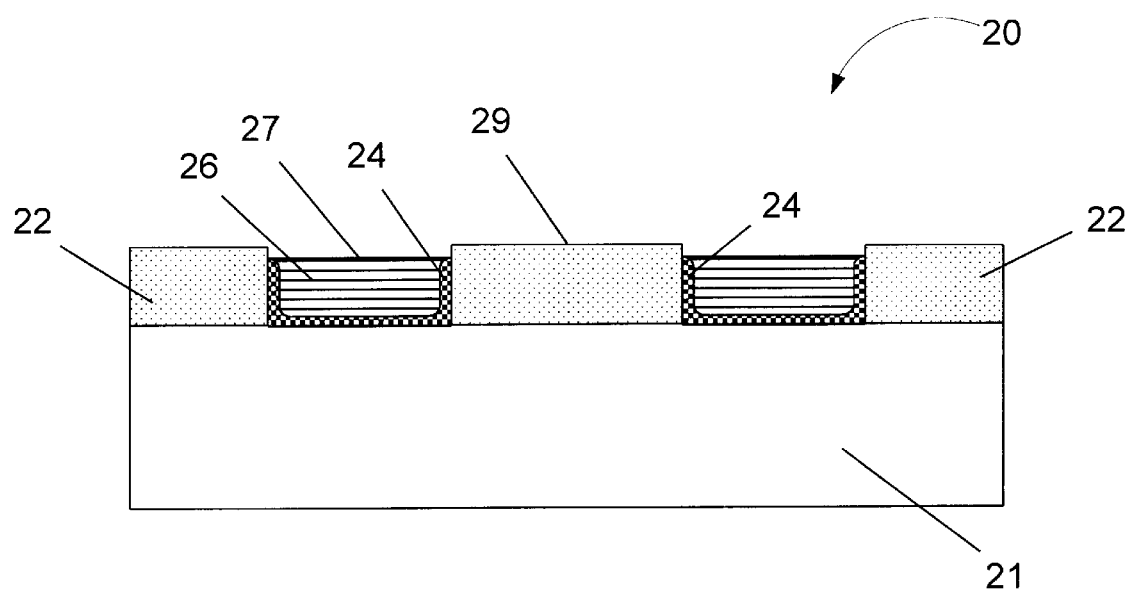
FIG. 5 is a cross-sectional view of the device shown in FIG. 4 after further timed polishing operations have been performed at the second polishing platen.
Figure 6:
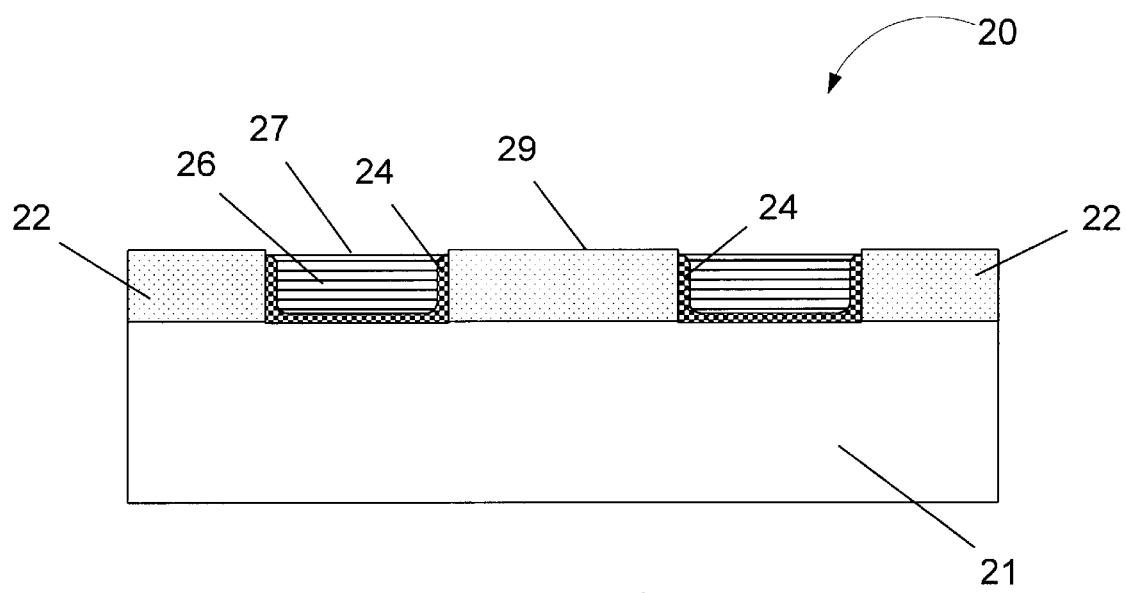
FIG. 6 is a cross-sectional view of the device shown in FIG. 5 after additional polishing operations are performed at a third polishing platen of the polishing tool.

At platen 2, the remaining copper layer 26 is removed at a much slower rate, e.g., on the order of approximately 6–10 nm/sec (60–100 Å /sec) by the use of a lower downforce pressure. This is an endpoint process that is stopped when an optical sensor on the polishing tool 10 detects when substantially all of the copper has been removed, at least in the area where the optical sensor is focused, thereby exposing the barrier metal layer 24. This situation is depicted in FIG. 4. Thereafter, a timed overpolish process is performed at platen 2 for a set duration. This overpolish process is used to remove residual copper, as the endpoint process is not perfect, and to begin removing the barrier metal layer 24. FIG. 5 depicts the wafer after the timed overpolishing operations have been completed at platen 2 and a relatively small portion of the barrier metal layer 24 above the patterned layer of insulating material 22 is removed. Note that, at this point in the process, the surface 27 of the copper layer 26 is lower than the surface 29 of the insulating material layer 22 due to the overpolishing process selectively removing more of the copper layer 26 than the barrier metal layer 24.

At platen 3, a timed polishing process is performed to insure complete removal of the remaining portion of the barrier metal layer 24. See FIG. 6. During this process, some of the underlying layer of insulating material 22 is also removed. In some processing recipes, there may be a targeted erosion of the patterned layer of insulating material 22 of approximately 30 nm, for example, during this process.

In general, it is desirable that the endpoint polishing operation performed at platen 2 be performed for a relatively short duration. That is, given the relatively low removal rate employed during this endpoint operation, it is desirable that the process not be performed for too long of a duration. Otherwise, excessive delay may result in the overall chemical mechanical polishing operations. Moreover, in some situations, the duration of the endpoint polishing operation performed at platen 2 should also have some minimal value. This minimal value insures that the bulk removal of the copper layer 26 is not so aggressive that it removes the underlying layer of insulating material 22.

However, due to variations in the thickness of the incoming copper layer 26, the endpoint polishing process performed at platen 2 may be performed for a relatively long duration. That is, given that the polishing operation performed at the first platen is a timed process, an incoming layer of copper 26 that is thicker than anticipated will result in more copper having to be removed during the endpoint polishing process to be performed at platen.

The present invention is directed to a control methodology for controlling the duration of an endpoint polishing process. In general, the method involves adjusting the duration of the timed polishing operation performed at platen 1 to control the duration of the endpoint polishing process performed at platen 2. The control methodology described herein may be understood by reference to the following equation:

$$Thk_{cu} = R_1(t_1) + (T_2)(R_2)(t_2^{ept})$$

wherein $Thk_{cu}$ is the thickness of a deposited layer of copper; $R_1$ is the rate of removal at platen 1; $t_1$ is the duration of polishing operations at platen 1; $R_2$ is the rate of removal at platen 2 during the endpoint process; $t_2^{ept}$ is the duration of the endpoint process performed at platen 2; and $T_2$ is a factor to reflect the difference between removal rates determined from qualification or test wafers as compared to production wafers with underlying topographical features. The factor $R_1(t_1)$ represents the amount of the layer of copper 26 removed during the timed polishing operation at platen 1. The factor $(T_2)(R_2)(t_2^{ept})$ represents the amount of copper removed during the endpoint polishing operations performed at platen 2. Substantially all of the layer of copper 26 is removed after the timed polishing process performed at platen 1 and the endpoint polishing operation at platen 2 are performed.

As an initial matter, values for $R_1$ and $R_2$ are estimated from qualification or test wafers having a layer of copper formed thereabove. That is, a layer of copper 26 may be formed above another preexisting layer, e.g., a layer of silicon dioxide, in which there are substantially no underlying topographical features, e.g., metal lines, gate electrodes, etc. Determination of these rates $R_1$ and $R_2$, may involve destructive testing of the qualification wafers. The factor $T_2$ is a factor that is intended to account for variations in polishing a layer of copper 26 formed over substantially no underlying structure, as compared to forming a layer of copper 26 over layers containing additional structures, such as a layer of insulating material 22 having a plurality of conductive lines and/or plugs formed therein. The factor $T_2$ may range from approximately 1–3, and it may be determined by comparing the removal rates between blanket copper wafers and product pattern wafers. Ideally, the $T_2$ factor would vary from product to product, but not from tool to tool.

Initially, a removal rate $R_1$, $R_2$ for the timed polishing process and the endpoint polishing process, respectively, need to be estimated or determined from the results of various qualification tests. Assuming that the removal rates $R_1$ and $R_2$ remain relatively stable over a certain operating range, the duration $t_1$ of the timed polishing operations performed at platen 1 may be varied to drive and/or maintain the duration $(t_2^{ept})$ of the endpoint polishing operation to a relatively stable value. That is, after processing one or more wafers from an initial lot of wafers, the duration $(t_2^{ept})$ of the endpoint polishing operation may be compared to a desired or target value. The target value may be a single number value, or it may be a range of acceptable number values.

For example, after the endpoint polishing operations at platen 2 have been completed on a particular wafer or lot of wafers, the duration $(t_2^{ept})$ of the endpoint polishing process is known. The duration $(t_2^{ept})$ may be an average value for a number of wafers. If it is greater than a target value for endpoint duration $(t_2^{ept})$, the duration $(t_1)$ of the timed polishing process performed at platen 1 (bulk copper removal process) may be increased, to thereby reduce the magnitude of the amount of copper to be removed during subsequent endpoint polishing operations to be performed at platen 2. That is, the duration of the removal process at platen 1 will be increased to reduce the duration of the timed endpoint polishing process at platen 2. Conversely, if the incoming layer of copper 26 is too thin, the duration $(t_1)$ of the timed polishing process performed at platen 1 may be reduced until such time as the duration $(t_2^{ept})$ of the endpoint polishing operations performed at platen 2 is in line with a target value. The target value may be a single value or an acceptable range of values. This process continues to insure that the duration $(t_2^{edt})$ of the endpoint polishing operation performed at platen 2 is driven to a desired and hopefully minimal value. The values $R_1$ and $R_2$ may be updated from time to time as processing operations are performed. For example, some destructive testing operations may be performed on additional qualification or test wafers. Additionally, the $T_2$ factor may have to be adjusted depending upon the type of product under construction.

Figure 7:
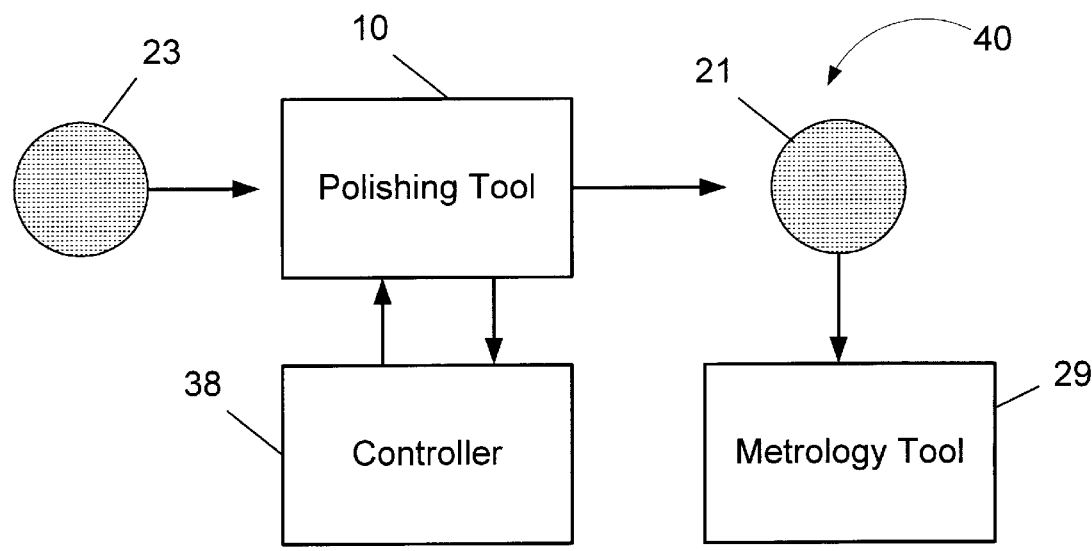
FIG. 7 is a schematic depiction of one embodiment of a system in which the present invention may be employed.

An illustrative system 40 that may be used in one embodiment of the present invention is shown in FIG. 7. The system 40 is comprised of a polishing tool 10, an illustrative metrology tool 29, and a controller 38. One or more test or qualification wafers 21, having a layer of metal or copper 26 formed thereabove that have previously been subjected to polishing operations in the polishing tool 10 are also depicted in FIG. 7. The metrology tool 29 may be used to take various measurements of the thickness of the layer of copper 26 formed on the test wafers 21 at various points in the process. For example, a scanning electron microscope may be used on cross-sectioned test wafers 21 prior to performing any polishing operation on the wafer to determine the approximate initial thickness of the layer of copper 26. Thereafter, a timed polish process is performed at platen 1. Destructive testing may again be performed on wafers subjected to such a polishing operation to determine the amount of the layer of copper 26 remaining. Based upon this information, a removal rate $R_1$ may be determined for the timed polishing operations performed at platen 1. Then, additional test wafers may be processed at platen 2 using an endpoint polishing operation. After the endpoint polishing operations are performed at platen 2, a removal rate $R_2$ may be determined based upon the incoming thickness of the layer of copper 26 as it enters platen 2, and the duration ($t_2^{ept}$) of the endpoint process. The thickness measurements of the layer of copper 26, both pre-polish and post-polish, may be performed on any desired number of wafers. For example, such measurements may be performed on all wafers in one or more lots, or on a representative number of wafers in a given lot. These determined values for $R_1$ and $R_2$ are initially input into the controller 38 when the system is initially installed. These initial values for $R_1$ and $R_2$ may or may not be adjusted later, i.e., later destructive testing may lead to different values for $R_1$ and $R_2$. Moreover, consumable changes, process drafts, etc. may also lead to different values for $R_1$ and $R_2$.

In operation, production wafers 23 are processed in the polishing tool 10. The controller 38 is provided with information regarding the duration ($t_2^{ept}$) of the endpoint polishing process performed at platen 2 of the polishing tool 10. If there is a deviation between the actual duration ($t_2^{ept}$) and a targeted value for the duration ($t_2^{ept}$) of the endpoint process, the controller determines or modifies the duration ($t_1$) of the timed polishing process performed at platen 1 to compensate for this deviation. That is, if the duration ($t_2^{ept}$) is greater than a target value, the duration ($t_1$) of the timed polishing process performed at platen 1 is increased. If the duration ($t_2^{ept}$) is less than a targeted value, the duration ($t_1$) of the timed polishing process at platen 1 is decreased. Using this technique, the duration ($t_2^{ept}$) may be maintained at a relatively stable, small value such that polishing operations may be performed in the polishing tool 10 in an efficient manner.

In the illustrated embodiment, the controller 38 is a computer programmed with software to implement the functions described herein. Moreover, the functions described for the controller 38 may be performed by one or more controllers spread through the system. For example, the controller 38 may be a fab level controller that is used to control processing operations throughout all or a portion of a semiconductor manufacturing facility. Alternatively, the controller 38 may be a lower level computer that controls only portions or cells of the manufacturing facility. Moreover, the controller 38 may be a stand-alone device, or it may reside on the polishing tool 1. However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 38, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699-Provisional Specification for CIM Framework Domain Architecture) and APC (SEMI E93-0999-Provisional Specification for CIM Framework Advanced Process Control Component) specifications are publicly available from SEMI.

The present invention is directed to a method of controlling chemical mechanical polishing operations to control the duration of an endpoint polishing process. The method comprises providing a wafer having a layer of copper 26 formed thereabove, performing a first timed polishing operation for a duration ($t_1$) on the layer of copper 26 at a first platen 1 to remove a majority of the layer of copper 26, performing an endpoint polishing operation on the layer of copper 26 at a second platen 2 to remove substantially all of the layer of copper 26, determining a duration ($t_2^{ept}$) of the endpoint polishing operation performed on the layer of copper 26 at the second platen 2, and determining, based upon a comparison between the determined duration ($t_2^{ept}$) of the endpoint polishing operation and a target value for the duration ($t_2^{ept}$) of the endpoint polishing operations, a duration ($t_1$) of the timed polishing operation to be performed on a subsequently processed layer of copper at the first platen 1. In another embodiment, the invention further comprises modifying, based upon a variance between the determined duration ($t_2^{ept}$) of the endpoint polishing operation and a target value for the duration ($t_2^{ept}$) of the endpoint polishing operation, the duration ($t_1$) of the timed polishing operation to be performed on a subsequently processed layer of copper at the first platen 1.

Through use of the present invention, polishing operations on modern integrated circuit devices may be performed in a more efficient and consistent manner. As a result, overall manufacturing efficiencies may be increased.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of polishing performed on a polishing tool comprised of at least first and second platens, the method comprising:
   providing a wafer having a layer of copper formed thereabove;
   performing a timed polishing operation on said layer of copper at said first platen to remove at least some of said layer of copper;
   performing an endpoint polishing operation on said wafer at said second platen to remove substantially all of said layer of copper remaining after said timed polishing operation is performed at said first platen;
   determining a duration of said endpoint polishing operation performed on said layer of copper at said second platen; and
   determining, based upon a comparison between the determined duration of said endpoint polishing operation and a target value for said endpoint polishing operation, a duration of a timed polishing process to be performed on a subsequently processed layer of copper at said first platen.

2. The method of claim 1, further comprising modifying, based upon a variance between said determined duration of said endpoint polishing operation and said target value for said duration of said endpoint polishing operation, a duration of said timed polishing operation to be performed on said subsequently processed layer of copper at said first platen.

3. The method of claim 2, further comprising increasing the duration of said timed polishing operation to be performed on said subsequently processed layer of copper at said first platen if said determined duration of said endpoint polishing operation is greater than said target value.

4. The method of claim 2, further comprising decreasing the duration of said timed polishing operation to be performed on said subsequently processed layer of copper at said first platen if said determined duration of said endpoint polishing operation is lesser than said target value.

5. The method of claim 1, wherein performing said timed polishing operation on said layer of copper at said first platen to remove at least some of said layer of copper comprises performing said timed polishing operation on said layer of copper at said first platen to remove at least 50% of said layer of copper.

6. The method of claim 1, wherein performing said endpoint polishing operation on said layer of copper at said second platen to remove substantially all of said layer of copper comprises performing an optically-sensed endpoint polishing operation on said layer of copper at said second platen to remove substantially all of said layer of copper.

7. The method of claim 1, further comprising performing additional polishing operations at a third platen of said polishing tool.

8. A method of polishing performed on a polishing tool comprised of at least first and second platens, the method comprising:
   providing a wafer having a layer of copper formed thereabove;
   performing a timed polishing operation on said layer of copper at said first platen to remove a majority of said layer of copper;
   performing an endpoint polishing operation on said layer of copper at said second platen to remove substantially all of said layer of copper remaining after said timed polishing operation is performed at said first platen;
   determining a duration of said endpoint polishing operation performed on said layer of copper at said second platen; and
   modifying, based upon a variance between said determined duration of said endpoint polishing operation and a target value for said duration of said endpoint polishing operation, a duration of a timed polishing operation to be performed on a subsequently processed layer of copper at said first platen.

9. The method of claim 8, further comprising increasing the duration of said timed polishing operation to be performed on said subsequently processed layer of copper at said first platen if said determined duration of said endpoint polishing operation is greater than said target value.

10. The method of claim 8, further comprising decreasing the duration of said timed polishing operation to be performed on said subsequently processed layer of copper at said first platen if said determined duration of said endpoint polishing operation is lesser than said target value.

11. The method of claim 8, wherein performing said timed first polishing operation on said layer of copper at said first platen to remove a majority of said copper layer comprises performing said timed polishing operation on said layer of copper at said first platen to remove between 50–80% of said layer of copper.

12. The method of claim 8, wherein performing said endpoint polishing operation on said layer of copper at said second platen to remove substantially all of said copper layer comprises performing an optically-sensed endpoint polishing operation on said layer of copper at said second platen to remove substantially all of said copper layer.

13. The method of claim 8, further comprising performing additional polishing operations at a third platen of said polishing tool.

14. A method of polishing performed on a polishing tool comprised of at least first and second platens, the method comprising:
   providing a wafer having a layer of copper formed thereabove;
   performing a timed polishing operation on said layer of copper at said first platen to remove between 50–80% of said layer of copper;

performing an endpoint polishing operation on said layer of copper at said second platen to remove substantially all of said copper layer remaining after said timed polishing operation is performed at said first platen;

determining a duration of said endpoint polishing operation performed on said layer of copper at said second platen; and modifying, based upon a variance between said determined duration of said endpoint polishing operation and a target value for said duration of said endpoint polishing operation, a duration of a timed polishing operation to be performed on a subsequently processed layer of copper at said first platen.

15. The method of claim 14, further comprising increasing the duration of said timed polishing operation to be performed on said subsequently processed layer of copper at said first platen if said determined duration of said endpoint polishing operation is greater than said target value.

16. The method of claim 14, further comprising decreasing the duration of said timed polishing operation to be performed on said subsequently processed layer of copper at said first platen if said determined duration of said endpoint polishing operation is lesser than said target value.

17. The method of claim 14, wherein performing said endpoint polishing operation on said layer of copper at said second platen to remove substantially all of said copper layer comprises performing an optically-sensed endpoint polishing operation on said wafer at said second platen to remove substantially all of said copper layer.

18. The method of claim 14, further comprising performing additional polishing operations at a third platen of said polishing tool.

19. A method of polishing performed on a polishing tool, the method comprising:

providing a wafer having a layer of copper formed thereabove;

performing a first polishing operation on said layer of copper to remove at least some of said layer of copper;

performing an endpoint polishing operation on said wafer to remove substantially all of said layer of copper remaining after said first polishing operation;

determining a duration of said endpoint polishing operation performed on said layer of copper; and determining, based upon a comparison between the determined duration of said endpoint polishing operation and a target value for said endpoint polishing operation, a duration of a first polishing process to be performed on a subsequently processed layer of copper.

20. The method of claim 19, wherein performing said first polishing operation comprises performing a first timed polishing operation.

21. The method of claim 19, wherein performing said first polishing operation on said layer of copper to remove at least some of said layer of copper comprises performing said first timed polishing operation on said layer of copper at a first platen of said polishing tool to remove at least some of said layer of copper.

22. The method of claim 21, wherein performing said endpoint polishing operation on said wafer comprises performing said endpoint polishing operation on said wafer at a second platen of said polishing tool.

23. The method of claim 19, further comprising modifying, based upon a variance between said determined duration of said endpoint polishing operation and said target value for said duration of said endpoint polishing operation, a duration of said first polishing operation to be performed on a subsequently processed layer of copper at said first platen.

24. The method of claim 23, further comprising increasing the duration of said first polishing operation to be performed on said subsequently processed layer of copper if said determined duration of said endpoint polishing operation is greater than said target value.

25. The method of claim 23, further comprising decreasing the duration of said first polishing operation to be performed on said subsequently processed layer of copper if said determined duration of said endpoint polishing operation is lesser than said target value.

26. The method of claim 19, wherein performing said first polishing operation on said layer of copper to remove at least some of said layer of copper comprises performing said first polishing operation on said layer of copper to remove at least 50% of said layer of copper.

27. The method of claim 19, wherein performing said endpoint polishing operation on said layer of copper to remove substantially all of said layer of copper comprises performing an optically-sensed endpoint polishing operation on said layer of copper to remove substantially all of said layer of copper.

28. The method of claim 19, further comprising performing additional polishing operations on said wafer in said polishing tool.

* * * * *